United States Patent
Reeves et al.

(10) Patent No.: US 11,215,868 B2
(45) Date of Patent: Jan. 4, 2022

(54) LIQUID CRYSTAL DEVICES

(71) Applicant: Flexenable Limited, Cambridge (GB)

(72) Inventors: William Reeves, Cambridge (GB); Barry Wild, Cambridge (GB); James Harding, Cambridge (GB)

(73) Assignee: Flexenable Limited, Cambridge (GB)

( * ) Notice: Subject to any disclaimer, the term of this patent is extended or adjusted under 35 U.S.C. 154(b) by 0 days.

(21) Appl. No.: 17/066,805

(22) Filed: Oct. 9, 2020

(65) Prior Publication Data
US 2021/0109402 A1 Apr. 15, 2021

(30) Foreign Application Priority Data
Oct. 10, 2019 (GB) .................................... 1914676

(51) Int. Cl.
| | | |
|---|---|---|
| *G02F 1/1335* | (2006.01) | |
| *G02F 1/133* | (2006.01) | |
| *G02F 1/1343* | (2006.01) | |
| *H01L 51/05* | (2006.01) | |
| *G02F 1/1368* | (2006.01) | |

(52) U.S. Cl.
CPC ...... *G02F 1/133528* (2013.01); *G02F 1/1368* (2013.01); *G02F 1/13306* (2013.01); *G02F 1/134309* (2013.01); *H01L 51/0541* (2013.01); *G02F 2201/123* (2013.01)

(58) Field of Classification Search
CPC ................................................ G02F 1/133528
See application file for complete search history.

(56) References Cited

U.S. PATENT DOCUMENTS

2007/0268428 A1  11/2007  Choi et al.
2017/0196133 A1*  7/2017  Yamaguchi ............. H01L 24/75
2017/0240810 A1*  8/2017  Hida ..................... C09B 31/043

FOREIGN PATENT DOCUMENTS

JP  2004264727 A  9/2004

OTHER PUBLICATIONS

Search Report from Great Britain Patent Application No. 1914676.0, dated May 19, 2020.

* cited by examiner

*Primary Examiner* — Edmond C Lau
(74) *Attorney, Agent, or Firm* — Dergosits & Noah LLP; Todd A. Noah

(57) ABSTRACT

A technique, comprising: removing a protective film from one side of a polarisation filter component to expose a dichroic doped polymer active film or a layer formed in situ on the dichroic doped polymer active film; and thereafter forming in situ on the side of the polarisation filter component one or more functional layers of a liquid crystal device.

5 Claims, 6 Drawing Sheets

LIQUID CRYSTAL DEVICES

CLAIM OF PRIORITY

This application claims priority to Great Britain Patent Application No. 1914676.0, filed Oct. 10, 2019, the contents of which are incorporated by reference in their entirety.

FIELD OF THE INVENTION

The production of a liquid crystal device may include: (a) preparing a liquid crystal (LC) cell comprising liquid crystal material contained between two components each comprising a support substrate and including at least one control component; and thereafter (b) laminating polariser filter components to both sides of the LC cell.

One type of polariser filter component comprises a doped, drawn/stretched polymer film whose substantially unidirectionally aligned polymer chains retain a substantially linear light-absorbing species in the direction of the polymer chain alignment (direction of drawing/stretching). This polymer film has the property (dichroism) that light in different polarisation states experiences a different absorption coefficient. This dichroic polymer film is laminated on both sides to optically neutral, protective polymer support films such as cellulose triacetate (TAC) polymer films.

The inventors for the present application arrived at the idea of using such a polarisation filter component itself as the support substrate on which to form in situ one or more layers of a component for a liquid crystal device. The inventors for the present application have conducted research around forming a stack of layers (that defines one or more transistors of a control component) in situ on the surface of one of the protective polymer support films of such a type of polarisation filter component (instead of a separate polymer support film component), and have identified difficulties in producing high resolution transistor circuits of a kind that had been successfully achieved with the conventional technique involving forming the stack of layers in situ on a dedicated polymer support film (separate to the polarisation filter component). The inventors for the present application have attributed these difficulties to displacement of the upper protective, support film of the polarisation filter component relative to the lower support film of the polarisation filter component during the changes in temperature and pressure involved in the process of building the stack of layers.

One aim of the present invention is to provide a solution to this problem.

The present invention provides a method, comprising: removing a protective film from one side of a polarisation filter component to expose a dichroic doped polymer active film or a layer formed in situ on the dichroic doped polymer active film; and thereafter forming in situ on the side of the polarisation filter component one or more functional layers of a liquid crystal device.

According to one embodiment, the method further comprises forming a cross-linked polymer layer on the side of the polarisation filter component in direct contact with the dichroic doped polymer active film, and forming the one or more functional layers over the cross-linked polymer layer.

According to one embodiment, forming one or more functional layers of a liquid crystal device comprises forming a stack of layers defining electrical circuitry for controlling the optical properties of liquid crystal material.

There is also hereby provided a method comprising: producing a control component for a liquid crystal display device by a method described above; and containing liquid crystal material between the control component and a counter component comprising another polarisation filter; wherein the stack of layers defines an array of pixel electrodes independently addressable via conductors of the electrical circuitry outside an active display area.

According to one embodiment, the electrical circuitry comprises active matrix circuitry.

There is also hereby provided a device, comprising: one or more functional layers of a liquid crystal device formed on a dichroic doped polymer active film of a polariser component without any intervening support film.

According to one embodiment, the one or more functional layers are formed on the active film via a cross-linked polymer layer formed in situ on the active film and in direct contact with the active film.

According to one embodiment, the one or more functional layers of a liquid crystal device comprise a stack of layers defining electrical circuitry for controlling the optical properties of liquid crystal material.

There is also hereby provided a control component for a liquid crystal display device comprising a device as described above; and containing liquid crystal material between the control component and a counter component comprising another polarisation filter; wherein the stack of layers defines an array of pixel electrodes independently addressable via conductors of the electrical circuitry outside an active display area.

According to one embodiment, the electrical circuitry comprises active matrix circuitry.

BRIEF DESCRIPTION OF THE FIGURES

Embodiments of the present invention are described in detail hereunder, by way of example only, with reference to the accompanying drawings, in which.

DETAILED DESCRIPTION

Techniques of the present invention are described below for the example of the production of an organic liquid crystal display (OLCD) cell. An OLCD cell comprises an organic transistor device (such as an organic thin film transistor (OTFT) device) for the control component. An organic transistor/OTFT is characterised by an organic semiconductor channel.

The same techniques are also applicable to e.g. the production of other types of liquid crystal devices using other types of semiconductors, and also to non-display liquid crystal devices such as adaptive lenses.

The detailed description below makes mention of specific process details (specific materials, etc.) that are not essential to achieving the technical effects described below. The mention of such specific process details is by way of example only, and other specific materials, processing conditions etc. may alternatively be used within the general teaching of the present application.

For example, the detailed description below is for the example of a fringe field switching (FFS) type LCD device, but the same technique is equally applicable to the production of other types of LCD devices, including both other types of LCD devices in which the counter electrode is on the same side of the LC material as the pixel electrode, and types of LCD devices in which the counter electrode is on the opposite side of the LC material to the pixel electrode.

Regarding another process detail, the detailed description below is for the example of an array of top-gate transistor devices, but the technique is equally applicable to e.g., the production of an array of bottom-gate transistors, or a mixed array of top-gate and bottom-gate transistors.

Figure 1:
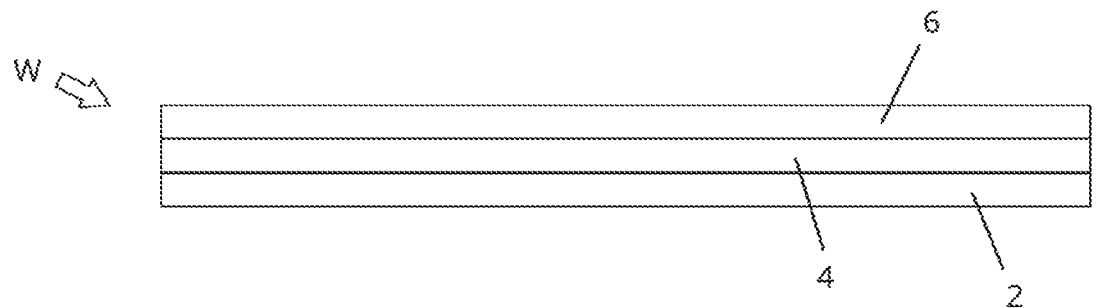
FIGS. 1-13 illustrate steps of a process according to an example embodiment of the present invention.

With reference to FIG. 1, the starting workpiece W comprises a polarisation filter component comprising an active film 4. In this example, the active film 4 is the product of stretching/drawing a polymer film including substantially linear light-absorbing species substantially aligned to the polymer chains. The polymer chains (and therefore also the light-absorbing species) exhibit a high degree of alignment by virtue of the drawing/stretching process. One example of such an active film 4 can be prepared by a process comprising: soaking a cast polyvinyl alcohol (PVA) film in an iodine/potassium iodide solution; rinsing the film in cold water and drying in a vacuum; wet-drawing the dried film in a boric acid solution; and dry-stretching the wet-drawn films at about 30° C. It has been observed that the resulting film comprises complexes formed between the PVA molecules and linear oligoiodine species. The oligoiodine species exhibit a high degree of alignment to the PVA molecules, and therefore to the direction of drawing/stretching. The resulting dichroic film exhibits a maximum degree of absorption (maximum absorption coefficient/minimum transmittance) for radiation having a polarisation parallel to the drawing/stretching direction, and a minimum degree of absorption (minimum absorption coefficient/maximum transmittance) for radiation having a polarisation perpendicular to the drawing/stretching direction.

A plastics support film 2 is laminated to one side of the active film 4 via adhesive, and a releasable protective film 6 is laminated to the other side of the active film 4.

The polarisation filter component may comprise one or more layers and/or films on the rear side of the plastics support film 2 (i.e., the side opposite the side on which the active film 4 is provided). For example, a hard coat may be formed in situ on plastics support film at the rear side thereof.

Figure 2:
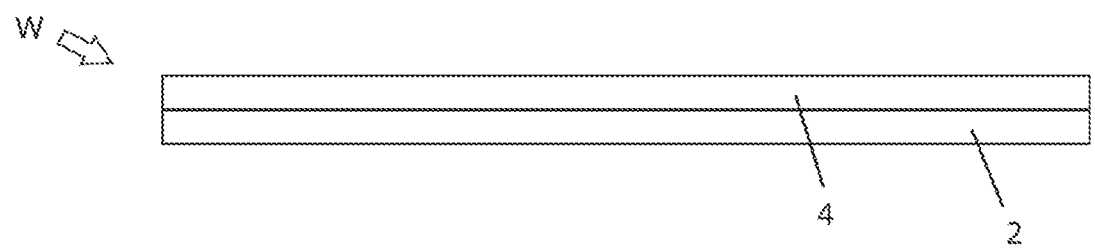
Figure 3:
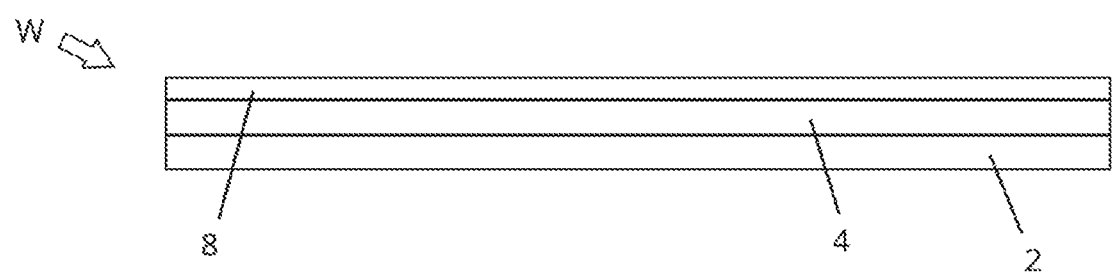

With reference to FIG. 2, processing of the workpiece W begins with peeling off the releasable protective film 6 to expose a surface of the active film 4 (or a layer formed in situ on the active film 4).

The inventors for the present application have found through experiment that: (i) the active film 4 remains substantially undamaged and retains good polarisation filter properties (as determined by confirming the low transmittance of unpolarised light through a combination of the processed polariser component under test and another, unprocessed polarisation component oriented at 90 degrees to the processed polariser component under test) even after exposure to some solvents; and (ii) a cross-linked polymer layer 8 formed in situ on the active film 4 by liquid processing from such a chemically compatible solvent can prevent damage and substantive deterioration of the polarisation filter properties of the active film 4, throughout subsequent processing of the workpiece W (including the active film 4) using chemically-incompatible solvents (e.g., water) that would otherwise damage the active film 4 without the cross-linked polymer layer 8.

Figure 4:
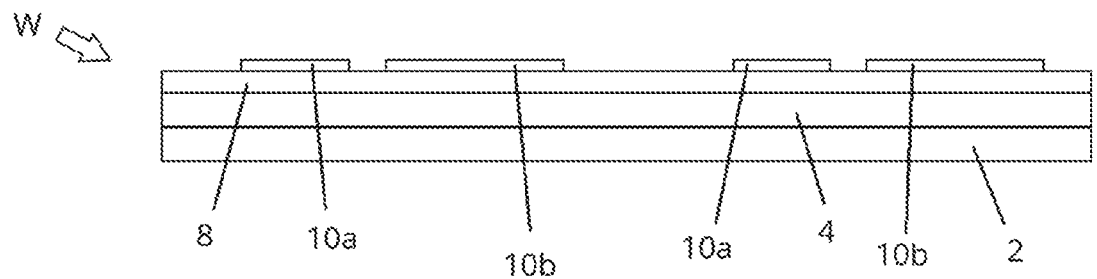

In this example, a drop of a solution of a cross-linkable material in the solvent propylene glycol methyl ether acetate (PGMEA) is deposited into contact with the active film 4, and is formed into a thin film over the active film 4 by spin-coating. In this example, the cross-linkable material comprises a negative photoresist material known as SU-8 and comprising Bisphenol A Novolac epoxy and a photoacid generator. After spin-coating, the workpiece W is subject to the following steps: soft bake at about 70° C. for about 10 minutes to remove most of the solvent from the SU-8 film; UV cure to effect cross-linking of the SU-8; final bake at about 70° C. for about 60 minutes; and 12 hours rest. With reference to FIG. 4, a source-drain conductor pattern 10a, 10b is formed in situ on the upper surface of the workpiece W over the cross-linked polymer layer 8. In this example, the formation of a source-drain conductor pattern in situ on the upper surface of the workpiece W over the cross-linked polymer layer 8 comprises depositing a layer of conductor material or a conductor stack comprising one or more of layers of conductor material on the upper surface of the workpiece W over the cross-linked polymer layer 8 by a vapour deposition technique such as sputtering, and then patterning the conductor layer/stack by a photolithographic process.

For simplicity, FIG. 4 shows only parts of the source-drain conductor pattern 10a, 10b that form source-drain electrodes defining the channel length of the semiconductor channels of the transistors, but the source-drain conductor pattern may comprise additional parts such as addressing lines that extend from the electrode parts to outside the active display area. For the example of the transistors forming an active matrix addressing circuit for a high resolution liquid crystal display device, the source-drain conductor pattern may comprise (i) an array of source conductors each providing the source electrodes for a respective row of transistors, and each extending to a region outside the active display area; and (ii) an array of drain conductors each providing the drain conductor for a respective transistor.

A self-assembled monolayer (SAM) of an organic injection material is then formed in situ on the exposed surface of the source/drain conductor pattern. This SAM further facilitates the transfer of charge carriers between the source-drain conductors and the organic semiconductor material 12 mentioned below. In this example, the SAM is formed in situ on the workpiece by a processing comprising: depositing a liquid film (solution/dispersion of the organic injection material) on the upper surface of the workpiece W by e.g., spin-coating; drying the liquid film to solidify the liquid film; and baking the solidified film.

Figure 5:
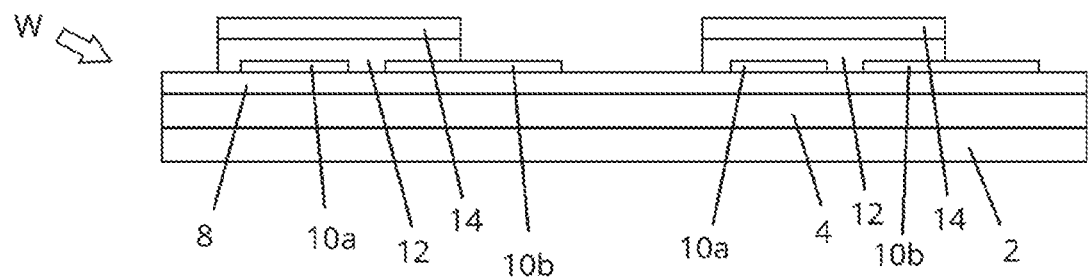

With reference to FIG. 5, a patterned stack of organic semiconductor and organic polymer dielectric layers 12, 14 is thereafter formed in situ on the new upper surface of the workpiece W. In this example, the formation of this patterned stack comprises: (i) depositing a liquid film (solution/dispersion of the organic semiconductor material) on the upper surface of the workpiece W by e.g., spin-coating, drying the liquid film to solidify the liquid film, and baking the solidified film; (ii) depositing a liquid film (solution/dispersion of the polymer dielectric material) on the upper surface of the baked organic semiconductor film by e.g., spin-coating, drying the liquid film to solidify the liquid film, and baking the solidified film; and (iii) creating substantially the same pattern in both layers using a photolithographic technique and reactive ion etching. The pattern comprises an array of isolated islands, each island providing the semiconductor channel for a respective transistor.

Figure 6:
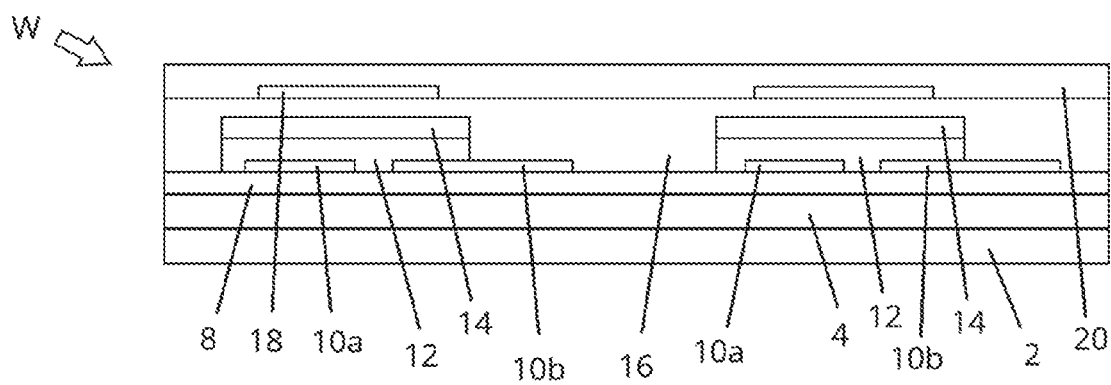

With reference to FIG. 6, a layer 16 of organic polymer dielectric material (exhibiting a higher dielectric constant (k) than the underlying dielectric layer 14) is formed in situ on the new upper surface of the workpiece W. In this example, the layer 16 of high-k dielectric material is formed in situ on the workpiece W by a process comprising: depositing a liquid film (solution/dispersion of the high-k dielectric material) on the upper surface of the workpiece W by e.g., spin-coating, drying the liquid film to solidify the liquid film, and baking the solidified film. This is followed by the formation, in situ on the surface of the baked high-k dielectric layer, of a gate conductor pattern 18. In this example, the gate conductor pattern is formed in situ on the workpiece W by a process comprising: forming a conductor layer (or a stack of conductor layers) on the workpiece W by a vapour deposition technique such as sputtering; and patterning the conductor layer/stack by a photolithographical technique. In this example, the stack of layers formed in situ on the polarisation filter active film 4 define an active matrix addressing circuit, and the gate conductor pattern 18 comprises an array of gate conductors each providing the gate electrode for a respective column of transistors, and each extending to a region outside the active display area. Each transistor in the active matrix array is associated with a respective unique combination of gate and source conductors, whereby each transistor can be independently addressed via parts of the gate and source conductors outside the active display area.

One or more layers of organic polymer insulating material 20 are formed in situ on the new upper surface of the workpiece W. In this example, the one or more insulating layers 20 are formed in situ on the upper surface of the workpiece W by a process comprising: depositing a liquid film (solution/dispersion of the insulating material) on the upper surface of the workpiece W by e.g., spin-coating, drying the liquid film to solidify the liquid film, and baking the solidified film.

Figure 7:
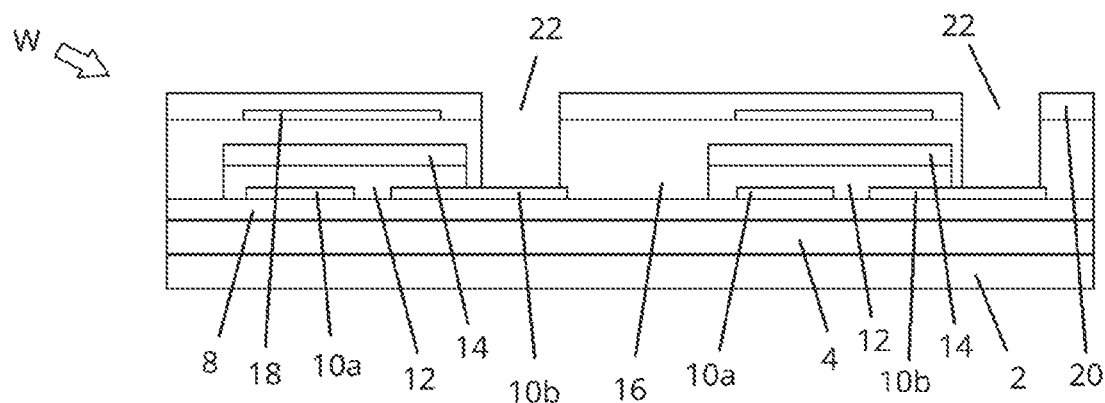

With reference to FIG. 7, the upper surface of the workpiece W is thereafter patterned to create an array of via holes 22, each via hole extending down to a respective drain conductor 10b. In this example, this patterning comprises: forming in situ on the upper surface of the workpiece W a patterned photoresist mask covering all regions of the upper surface of the workpiece W except in the regions where the via holes 22 are to be formed; exposing the workpiece W to a reactive ion etching (RIE) plasma that etches the insulating layer 20 and upper gate dielectric layer 16; and removing the photoresist mask to again expose the upper surface of the insulating layer 20.

Figure 8:
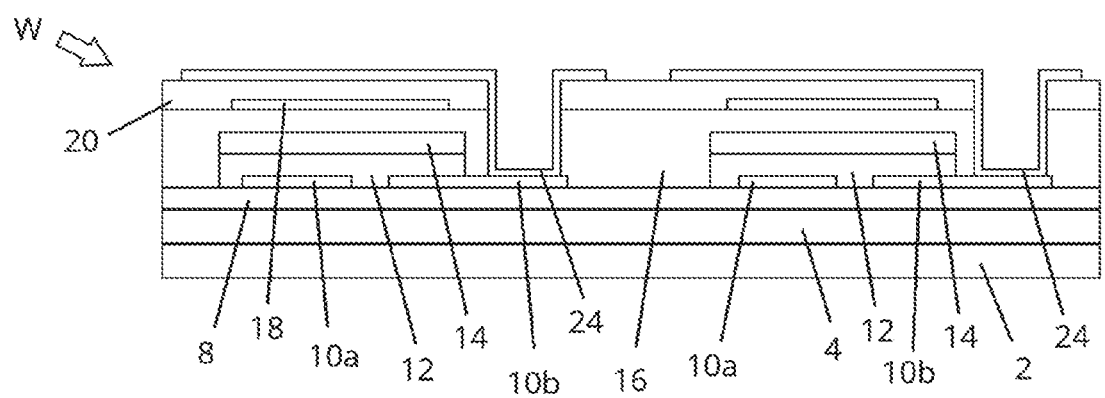

With reference to FIG. 8, a pixel electrode pattern 24 is then formed in situ on the new upper surface of the workpiece. The pixel electrode pattern defines an array of isolated pixel electrodes, each contacting a respective drain conductor 10b via a respective via hole 22. In this example, the pixel electrode pattern 24 is formed in situ on the workpiece W by a process comprising: forming a conductor layer or stack of conductor layers in situ on the workpiece W by a vapour deposition technique such as sputtering; and patterning the conductor layer/stack by a photolithographic technique.

Figure 9:
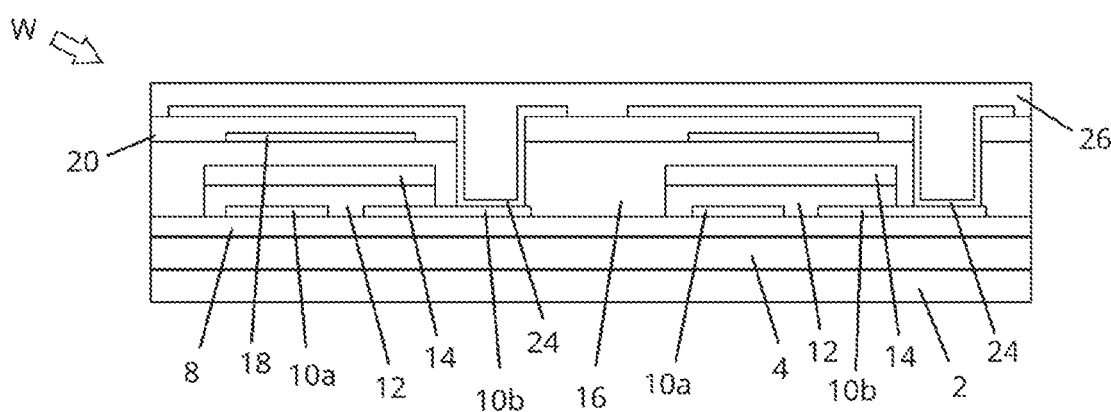

With reference to FIG. 9, a further polymer insulating layer 26 (or stack of further polymer insulating layers) is formed in situ on the new upper surface of the workpiece W. In this example, the insulating layer/stack is formed in situ on the workpiece by a process comprising: depositing a liquid film (solution/dispersion of the polymer insulating material) on the upper surface of the workpiece W by e.g., spin-coating, drying the liquid film to solidify the liquid film, and baking the solidified film.

Figure 10:
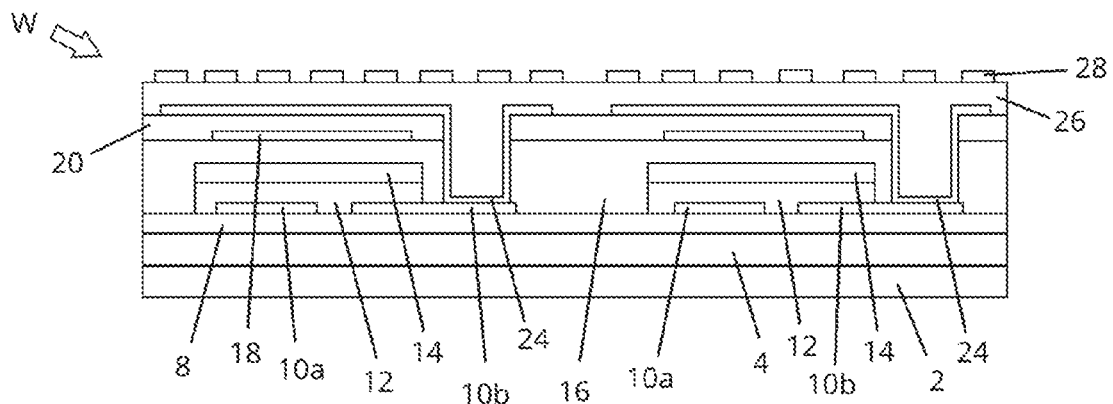

With reference to FIG. 10, a common electrode pattern 28 is formed in situ on the upper surface of the further insulating layer 26. In this example, the in situ formation of the common electrode pattern comprises: forming a conductor layer or a stack of conductor layers in situ on the upper surface of the further insulating layer 26 by a vapour deposition technique such as sputtering; and patterning the conductor layer/stack in situ on the workpiece W by a photolithographic technique.

Figure 11:
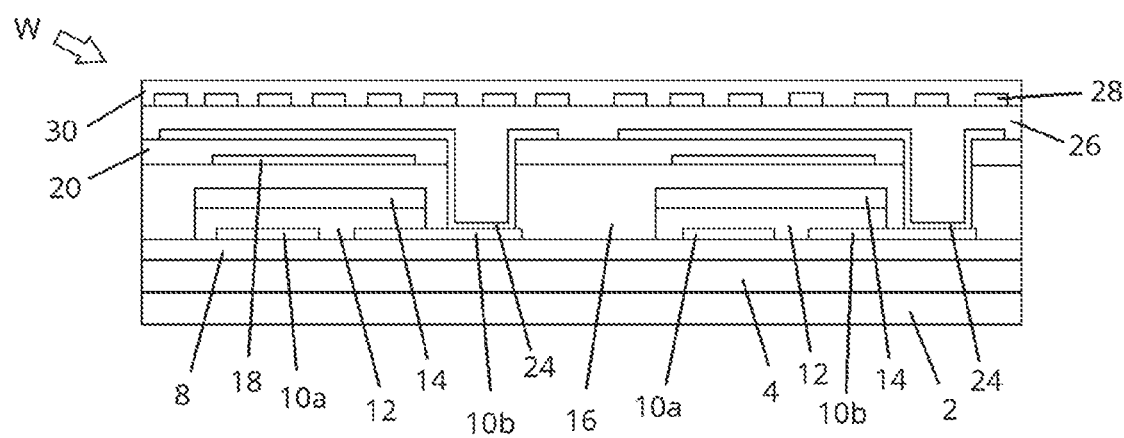

With reference to FIG. 11, a LC alignment layer 30 is formed in situ on the new upper surface of the workpiece W. In this example, the in situ formation of the LC alignment layer 30 comprises: depositing a liquid film (solution/dispersion of the alignment material, e.g., polyamide) on the upper surface of the workpiece W by e.g., spin-coating; drying the liquid film to solidify the liquid film; baking the solidified film; and physically rubbing the baked film in a single direction.

Figure 12:
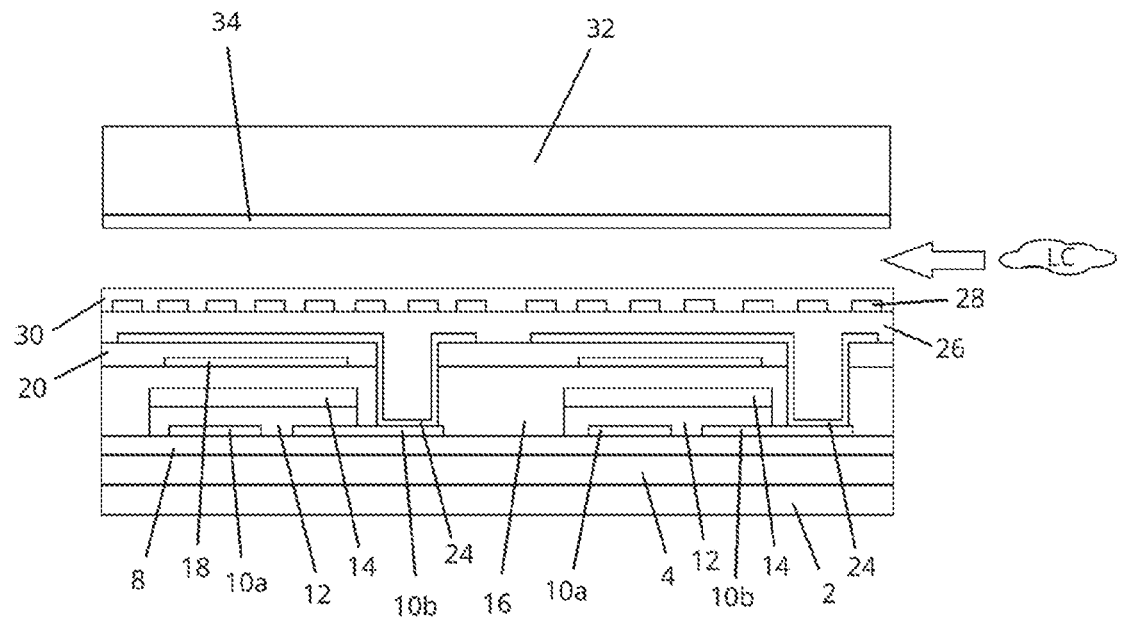
Figure 13:
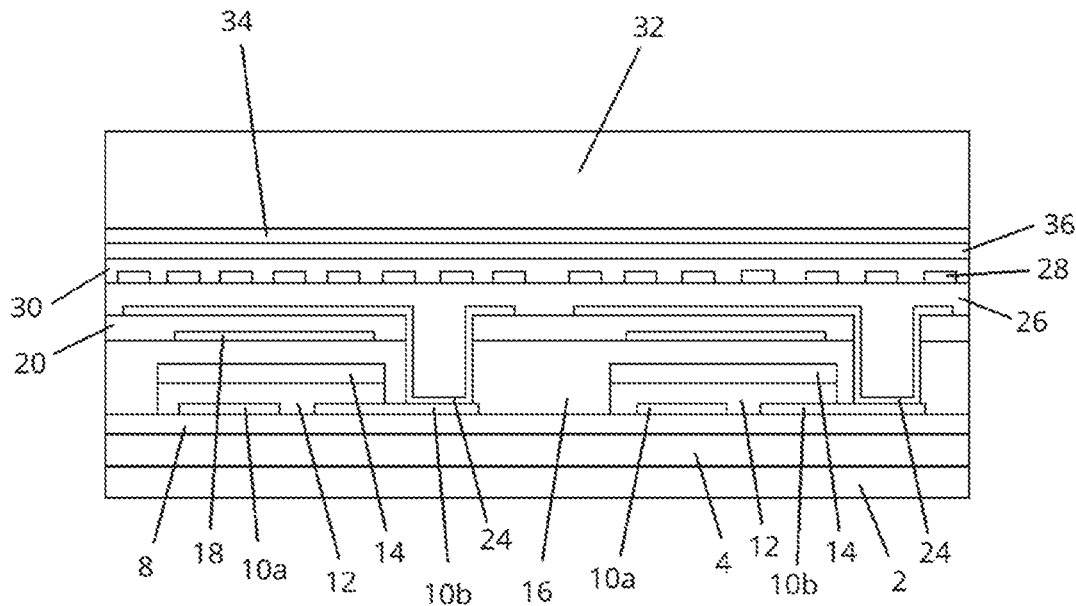

With reference to FIGS. 12 and 13, a counter component is prepared comprising another polarisation filter component 32 coated with another LC alignment layer 34. The workpiece W and counter component are pressed together. Spacers (either an ordered array of spacer structures forming an integral part of one or more of the workpiece W and counter component, and/or a random scattering between the workpiece W and the counter component of separate pre-prepared spacer elements such as spacing beads/balls/fibres) achieve a precisely determined separation distance between the two components. Liquid crystal material 36 is introduced into between the two components e.g. by a one drop fill (ODF) method involving dispensing a carefully controlled volume of LC material onto one of the two components before pressing the two components together under vacuum, or e.g., a vacuum fill method involving filling the pre-assembled cell with LC material by capillary action. The LC alignment surfaces provided by the LC alignment layers 30, 34 on opposite sides of the thickness of LC material determine the director (orientation of the LC molecules) of the LC material in each pixel region in the absence of an overriding electric field generated by a voltage between the respective pixel electrode 24 and counter electrode 28. In this example, a change in electric potential at a pixel electrode can change the degree to which the LC material in the respective pixel region rotates the polarisation of polarised light, and thereby can change the transmittance of light through the combination of the two polarisation filters 4, 32 in the respective pixel region. As mentioned above, each pixel electrode 24 is in contact with the drain conductor 10b of a respective transistor; and the electric potential at each pixel electrode (relative to the electric potential at the counter electrode 28) is independently controllable via parts of the source and gate conductors outside the active display region.

Figure 14:
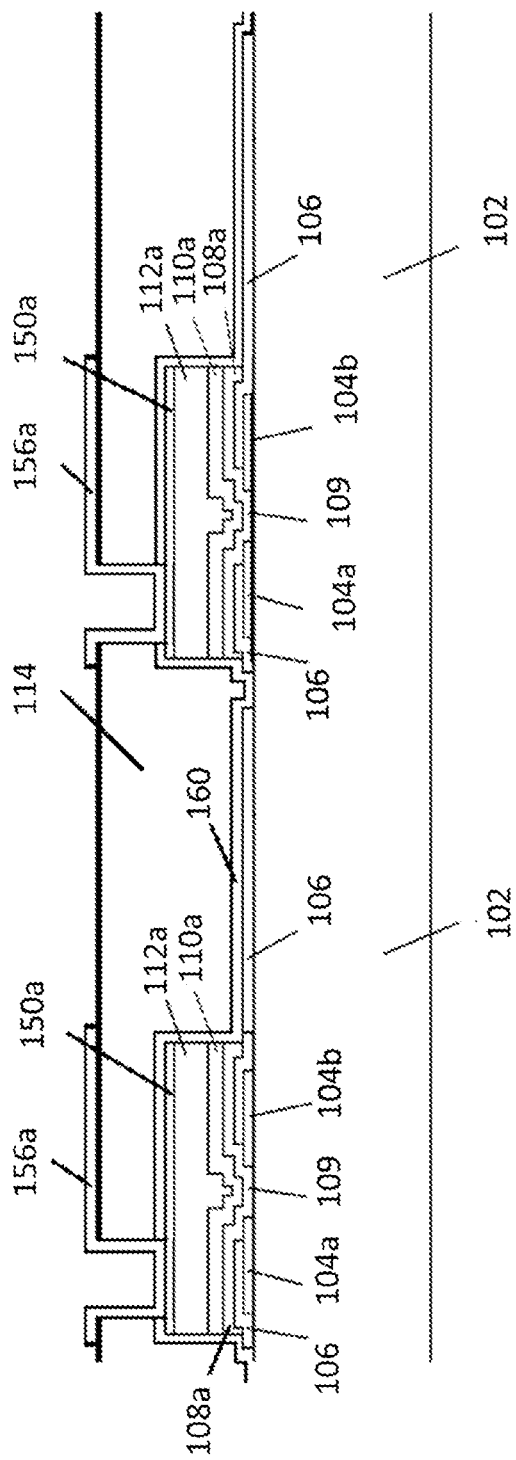
FIG. 14 illustrates one example of alternative architecture for the stack of layers defining the array transistors in the process of FIGS. 1-13.

FIG. 14 shows an alternative architecture for the stack of layers defining the transistors and pixel electrodes. In FIG. 14, element 102 designates the combination of elements 2, 4 and 8 in FIGS. 1-13. The stack of layers formed on the cross-linked polymer film 8 of element 102 comprises: (i) a lower metal pattern 104a, 104b; (ii) a transparent conductor pattern 106; (iii) an array of isolated islands (each comprising a semiconductor layer 108a; a first gate dielectric layer 110a interfacing the semiconductor layer 108a; a second gate dielectric layer 112a; and a continuous conductive metal oxide (e.g., ITO) layer 150a); (iv) an inorganic insulating passivation layer (e.g., aluminium nitride layer) 160 and an electrically insulating organic planarisation layer 114, formed in sequence after forming the isolated islands mentioned above, and patterned to define through holes down to the ITO layer 150a of each isolated island, in regions outside the channel regions 109; (v) a patterned metal layer 156a formed over the organic planarisation layer 114, and defining gate conductor lines each contacting the ITO gate electrodes 150a for a respective row of transistors, and each extending beyond the edge of the array of transistors.

The lower metal pattern (e.g., silver (Ag) metal pattern) defines at least (i) an array of source conductors each providing the source electrodes 104a for a respective column of TFTs, and each comprising a conductor line extending outside the array of transistors; and (ii) an array of drain conductors 104b each associated with a respective pixel electrode (discussed below).

The transparent conductor (e.g., ITO) pattern 106 defines pixel electrodes each contacting a respective drain conductor 104b.

Each isolated island defines a semiconductor (e.g. organic conjugated polymer semiconductor) channel 109 of the respective transistor in electrical series between the drain conductor 104b of the transistor and the part of the respective source conductor 104a in closest proximity to that drain conductor 104b. Each isolated island also defines a gate dielectric for the respective transistor, comprising the interface gate dielectric layer 110a and the uppermost gate dielectric layer 112a (e.g., electrically insulating polymer layers). Each isolated island also defines the gate electrode 150a for the respective transistor.

The above-described technique involves building in situ directly on the active film of a polariser component (or a layer formed in situ on the active film) a stack of layers that define an array of pixel electrodes for a display device and electrical circuitry for independently addressing each pixel electrode. However, the same technique of forming one or more layers in situ directly (i.e., other than via a support film) on a stretched PVA/iodine active film is also applicable to the construction of other components for LC devices, including display devices and non-display devices such as adaptive lenses.

As mentioned above, examples of techniques according to the present invention have been described in detail above with reference to specific process details, but the technique is more widely applicable within the general teaching of the present application. Additionally, and in accordance with the general teaching of the present invention, a technique according to the present invention may include additional process steps not described above, and/or omit some of the process steps described above.

In addition to any modifications explicitly mentioned above, it will be evident to a person skilled in the art that various other modifications of the described embodiment may be made within the scope of the invention.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features.

What is claimed is:

1. A method, comprising: removing a protective film from one side of a polarisation filter component to expose a dichroic doped polymer active film or a layer formed in situ on the dichroic doped polymer active film; and thereafter forming in situ on the side of the polarisation filter component one or more functional layers of a liquid crystal device.

2. The method according to claim 1, comprising forming a cross-linked polymer layer on the side of the polarisation filter component in direct contact with the dichroic doped polymer active film, and forming the one or more functional layers over the cross-linked polymer layer.

3. The method according to claim 1, wherein forming one or more functional layers of a liquid crystal device comprises forming a stack of layers defining electrical circuitry for controlling the optical properties of liquid crystal material.

4. The method according to claim 3, wherein the stack of layers forms at least part of a control component for a liquid crystal display device; and wherein the method further comprises containing liquid crystal material between the control component and a counter component comprising another polarisation filter; wherein the stack of layers defines an array of pixel electrodes independently addressable via conductors of the electrical circuitry outside an active display area.

5. The method according to claim 4, wherein the electrical circuitry comprises active matrix circuitry.

* * * * *